(12) United States Patent
Mittelstadt

(10) Patent No.: US 12,066,465 B2
(45) Date of Patent: Aug. 20, 2024

(54) CURRENT SENSING USING PANEL PLANE

(71) Applicant: Schneider Electric USA, Inc., Andover, MA (US)

(72) Inventor: Chad R. Mittelstadt, Cedar Rapids, IA (US)

(73) Assignee: Schneider Electric USA, Inc., Boston, MA (US)

( * ) Notice: Subject to any disclaimer, the term of this patent is extended or adjusted under 35 U.S.C. 154(b) by 632 days.

(21) Appl. No.: 17/297,634

(22) PCT Filed: Dec. 26, 2019

(86) PCT No.: PCT/US2019/068550
§ 371 (c)(1),
(2) Date: Jun. 10, 2021

(87) PCT Pub. No.: WO2020/139927
PCT Pub. Date: Jul. 2, 2020

(65) Prior Publication Data
US 2022/0034944 A1    Feb. 3, 2022

Related U.S. Application Data

(60) Provisional application No. 62/785,930, filed on Dec. 28, 2018.

(51) Int. Cl.
*G01R 15/20* (2006.01)
*H02B 1/30* (2006.01)

(52) U.S. Cl.
CPC ........... *G01R 15/207* (2013.01); *H02B 1/303* (2013.01)

(58) Field of Classification Search
CPC .... G01R 15/207; G01R 15/20; G01R 15/202; G01R 15/205; G01R 15/148; H02B 1/303
See application file for complete search history.

(56) References Cited

U.S. PATENT DOCUMENTS

| | | | |
|---|---|---|---|
| 4,616,207 A | 10/1986 | Knapp, Jr. et al. | |
| 6,175,229 B1 * | 1/2001 | Becker | G01R 15/20 324/127 |
| 6,268,989 B1 | 7/2001 | Dougherty et al. | |
| 9,285,437 B2 | 3/2016 | Rushmer et al. | |
| (Continued) | | | |

OTHER PUBLICATIONS

International Search Report and Written Opinion dated Mar. 5, 2020 for PCT/US2019/068550, 16 pages.

*Primary Examiner* — Jay Patidar
(74) *Attorney, Agent, or Firm* — Locke Lord LLP

(57) ABSTRACT

An apparatus for sensing current on a conductor of an electrical panel includes at least one sensing system, which comprises a ferromagnetic body and a sensor. The body can be formed of a ferro-magnetic material, such as for example steel. The ferromagnetic body can have two legs, which when placed on a load-side of the electrical panel, is configured to form, together with a back plane of the electrical panel, a magnetic path around the conductor. The ferromagnetic body comprises at least two parts with a first air gap therebetween along the magnetic path. The sensor, which is arranged in the first air gap, is configured to measure a current or other electrical property representative of current on the conductor based on the magnetic field across the first air gap.

16 Claims, 11 Drawing Sheets

(56) References Cited

U.S. PATENT DOCUMENTS

| | | | |
|---|---|---|---|
| 2006/0043960 A1* | 3/2006 | Itoh | G01R 15/185 |
| | | | 324/117 R |
| 2010/0177750 A1 | 7/2010 | Essinger et al. | |
| 2015/0084617 A1* | 3/2015 | Popovic | G01R 15/207 |
| | | | 324/127 |
| 2015/0091557 A1* | 4/2015 | Rushmer | G01R 15/20 |
| | | | 335/297 |

* cited by examiner

CURRENT SENSING USING PANEL PLANE

The present application claims priority to U.S. Provisional Application Ser. No. 62/785,930, entitled CURRENT SENSING USING PANEL PLANE, which was filed on Dec. 28, 2018 and is incorporated herewith in its entirety.

TECHNICAL FIELD

The present disclosure relates generally to an apparatus, system and method of sensing current in electrical equipment such as an electrical panel, and more specifically, to sensing current in an electrical panel using a part of the panel.

BACKGROUND

Current sensors are employed to monitor electrical equipment. However, in electrical panels, such as combination service entrance devices (CSEDs), there is limited space and areas to employ traditional current sensors to monitor current on the line(s), and the utility compartment is off limits for customer devices. Installing current sensors on the line-side may also pose a greater risk to an installer.

SUMMARY

In accordance with one or more embodiments, there is provided an apparatus for sensing current on a conductor of an electrical panel. The apparatus includes at least one sensing system, which comprises a ferromagnetic body and a sensor. The body can be formed of a ferromagnetic material, such as for example steel. The ferromagnetic body can have two legs, which when placed on a load-side of the electrical panel, is configured to form, together with a plane of the electrical panel, a magnetic path around the conductor, such as a bus bar. The ferromagnetic body comprises at least two parts with a first air gap therebetween along the magnetic path. The sensor, which is arranged in the first air gap, is configured to measure a current or other electrical property representative of current on the conductor based on the magnetic field across the first air gap.

The sensor can be a Hall-effect sensor (also referred to as a Hall sensor) or other sensor to measure magnetic properties in the gap. Each of the two parts can have a first end and a second end. The first ends of the two parts can be separated to form the first air gap, and the second end can be the ends of the two legs. Each of the two parts can be formed in an L-shape, and the body can have a U-shape. The first air gap can be formed between adjacent side portions of the first ends of the two parts or between adjacent end portions of the first ends of the two parts. The body or parts thereof can be formed from a thin sheet of ferromagnetic material (e.g., steel), using for example stamping, cutting and/or other manufacturing techniques.

The plane of the electrical panel can comprise a ferromagnetic part of a wall of a housing for the electrical panel or a part of a ferromagnetic plate installed below the conductor in the electrical panel. The electrical panel can comprise a panel board or a load center, which can include a main breaker which separates a line-side and a load-side. The load-side of the panel can include bus bars, bus studs and stabs, insulators and other components, which together are arranged and configured to receive devices, such as circuit protective devices (e.g., circuit breakers or interrupters, relays, etc.). The load-side can include bus bars that run vertically along a left side and a right side of the panel.

The apparatus can also include a communication device (e.g., a transmitter/receiver) to perform wireless or wireline communication with a remote computer device or system. The apparatus can also include a processor, in communication with the sensor and the communication device and other components of the apparatus, which is configured to receive a measurement from the sensor, to receive a voltage signal from the voltage connector or voltage tap or a voltage measurement associated therewith, to perform calculations for determining power or other electrical property according to measurements for example of current, voltage and/or other measurable electrical property on the conductor, and to transmit information associated with the measurement(s) to the remote device for further analysis or action (e.g., reporting, alarm, etc.). The apparatus can also include a memory to store computer executable code or programs or software, which when executed by a processor(s), controls the operations of the apparatus and its components. The memory can also store other data used by the apparatus or components thereof to perform the operations described herein.

The apparatus can also include a housing (or enclosure) for housing one or more sensing systems, the processor, a power supply system and the communication device, and include one or more fasteners to detachably connect the housing to the electrical panel. The housing is configured to fit adjacent to a load-side of a main breaker on the electrical panel. The housing can have a U-shape with two housing legs. The one or more sensing systems can include a first one of the sensing systems and a second one of the sensing systems. Each of the first and second sensing systems can be housed in a corresponding one of the two housing legs. Each of the first and second sensing systems is configured to form a corresponding magnetic path together with the plane of the electrical panel (e.g., a back plane) around a corresponding conductor on the electrical panel. Each of the corresponding conductors can be a bus bar on the electrical panel.

The apparatus can further include voltage connectors configured to connect to corresponding bus studs of the corresponding bus bars on the electrical panel. The voltage connectors can be used to supply power to the components of the apparatus, or to monitor a voltage on the buses. Each of the two housing legs can be arranged between a load-side of the main circuit breaker and a corresponding bus stud of the electrical panel.

Each end of the two legs can form second and third air gaps with the back plane of the electrical panel along the magnetic path. The first, second or third air gap can comprise one of air, or an insulator.

In another embodiment, there is provided a method of sensing current on a conductor in an electrical panel. The method involves providing a ferromagnetic body having two legs, which when placed on a load-side of the electrical panel is configured to form, together with at least a plane of the electrical panel, a magnetic path around the conductor. The ferromagnetic body comprises at least two parts with a first air gap therebetween along the magnetic path. The method further involves measuring, via a sensor arranged in the first air gap, a current or other electrical property representative of current on the conductor based on the magnetic field across the first air gap.

Additional objects and advantages will be set forth in part in the description which follows, and in part will be obvious from the description, or may be learned by practice of the present disclosure and/or claims. At least some of these objects and advantages may be realized and attained by the elements and combinations particularly pointed out in the appended claims. It is to be understood that both the foregoing general description and the following detailed description are exemplary and explanatory only and are not restrictive of the invention, as disclosed or claimed. The claims should be entitled to their full breadth of scope, including equivalents.

BRIEF DESCRIPTION OF THE DRAWINGS

These accompanying drawings are not intended to be drawn to scale. In the drawings, each identical or nearly identical component that is illustrated with various figures, are represented by a line numeral. For purposes of clarity, not every component may be labeled in every drawing. In the drawings.

DETAILED DESCRIPTION

Figure 1:
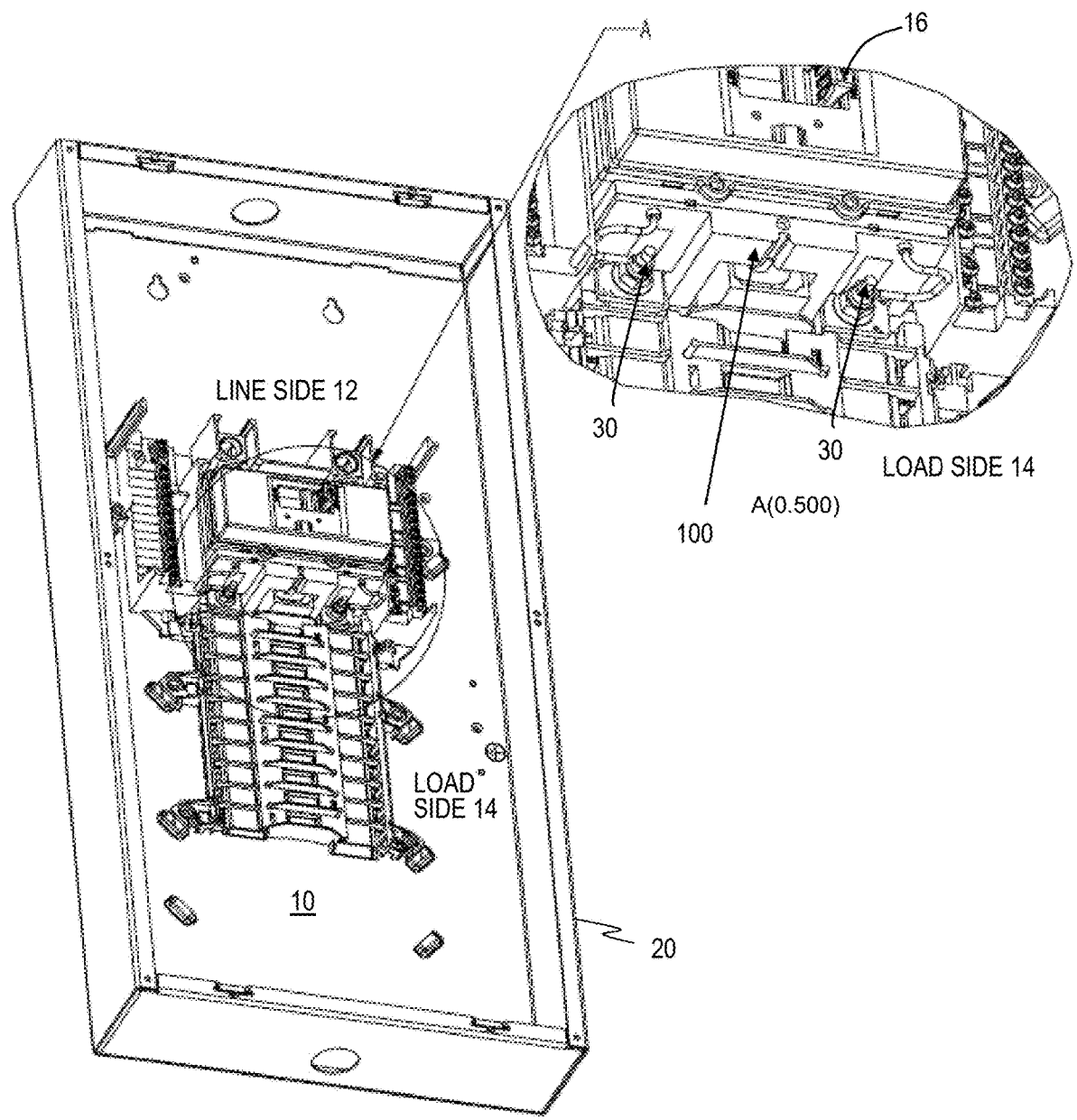
FIG. 1 illustrates an example of an electrical panel, such as a panelboard or load center with a sensor system for sensing current on a conductor in the electrical panel in accordance with an embodiment of the present disclosure.

This description and the accompanying drawings illustrate exemplary embodiments and should not be taken as limiting, with the claims defining the scope of the present disclosure, including equivalents. Various mechanical, compositional, structural, electrical, and operational changes may be made without departing from the scope of this description and the claims, including equivalents. In some instances, well known structures and techniques have not been shown or described in detail so as not to obscure the disclosure. Like numbers in two or more figures represent the same or similar elements. Furthermore, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

The present disclosure relates to an apparatus, system and method for monitoring current on a conductor in electrical equipment such as an electrical panel. The electrical panel can be a panelboard or load center (referred herein generally as "panelboard"). The apparatus or system can include a sensor system having a ferromagnetic body, which together with a plane of the electrical panel, are configured to form a magnetic path or magnetic circuit (generally referred to as "magnetic path") around the conductor to be monitored. The plane of the electrical panel can be a back wall or portion of the housing of the electrical panel. The sensor system also can include a sensor, such as a Hall-effect or other sensor, which is configured to sense a magnetic field resulting from current flow on the conductor. The sensor is arranged in an air gap along the magnetic path, and is configured to measure a current on the conductor or related electrical property based on the sensed magnetic field across the air gap (e.g., magnetic flux density or other magnetic property of the magnetic field). The magnetic path can concentrate the magnetic field (due to the current), such as along the gap in order to create a sufficiently strong enough field, which can allow a sensor to measure the field strength, and can also protect the sensing chain from external sources of magnetic fields, primarily for example from other conductors inside the panel.

Furthermore, by using a magnetic path that includes a plane of the electrical panel (or components thereof), a sensor system can be provided that can accurately measure current where normally there is maybe little or no space for traditional iron or air core sensors that need to fully surround conductor. The sensor system can fit in a space in the electrical panel that traditional sensors may not be able to fit. The sensor system can occupy an area that may be accessible and unused in present electrical panels. The sensor system also can be field installed into retrofit panels with minimal impact to the existing parts. No existing parts may need to be modified to accept the current sensing components of the sensor system on the panels. In addition, the sensor system and method thereof can provide for less voltage exposure risk on load-side of breaker VS line-side. In various embodiments, the sensor system can have a housing, which is made of an insulated material and is formed in a shape that can be arranged on or fitted onto the electrical panel, such as for example adjacent to a load-side of a main circuit breaker on the panel. Examples of such a sensor system will be described in further detail below with reference to the figures.

FIG. 1 illustrates a sensor system 100 arranged on an electrical panel 10 in accordance with an example embodiment. In this example, the electrical panel 10 can be a panelboard with a housing or enclosure (hereinafter "housing") 20. The electrical panel 10 can include line-side components on a line-side 12, load-side components on a load-side 14, and a circuit protective device such as a main circuit breaker 16 between the line-side and load-side components of the electrical panel 10. The line-side components are configured to connect an electrical power supply (or source) to the electrical panel 10. The load-side components are configured to control the distribution of electrical energy from the power supply to one or more branch circuits and any downstream loads connected thereto. The load-side components can include electrical conductor(s) such as bus bars (e.g., line buses), stabs, insulators, and/or other components of a panelboard. The load-side components can also be configured to receive or include circuit protective devices such as circuit breakers, relays and other circuit protective or monitoring devices. The main circuit breaker 16 can interrupt energy flow from the components of the line-side 12 to the load-side 14, in response to a user command (e.g., via a switch) or upon occurrence of certain conditions, such as a fault.

As further shown in FIG. 1, the sensor system 100 can be arranged on the load-side 14 of the electrical panel 10. In this example, the sensor system 100 can be installed between the main circuit breaker 16 and stud(s) 30 of conductor(s) such as bus bars of the electrical panel 10. The sensor system 100 can be configured to sense, measure, monitor, determine and/or derive one or more electrical properties of one or more conductors on the electrical panel 10. The electrical properties can include, for example, current, voltage, power or other electrical properties related to the conductor(s) to be monitored.

Figure 2:
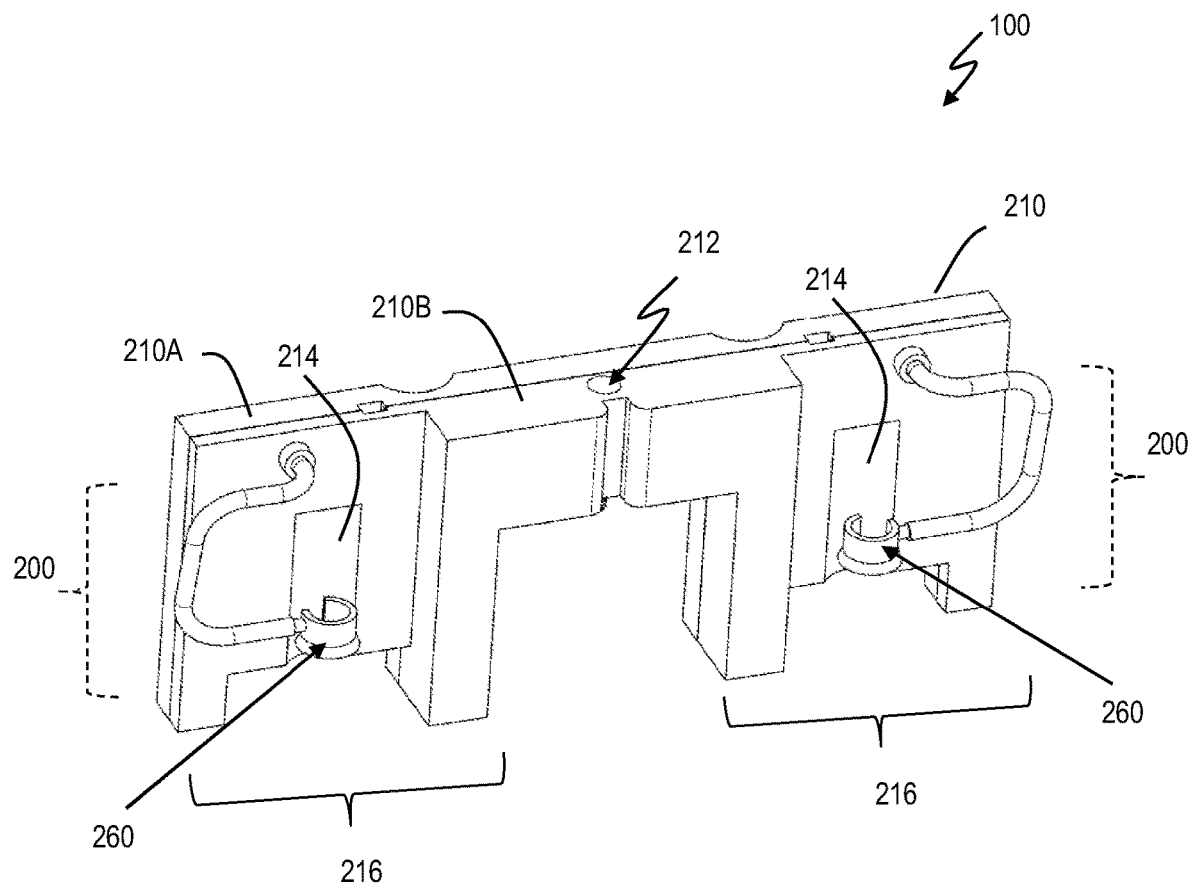
FIG. 2 illustrates an enlarged view of the sensor system of FIG. 1 and its housing in accordance with an embodiment of the present disclosure.
Figure 3:
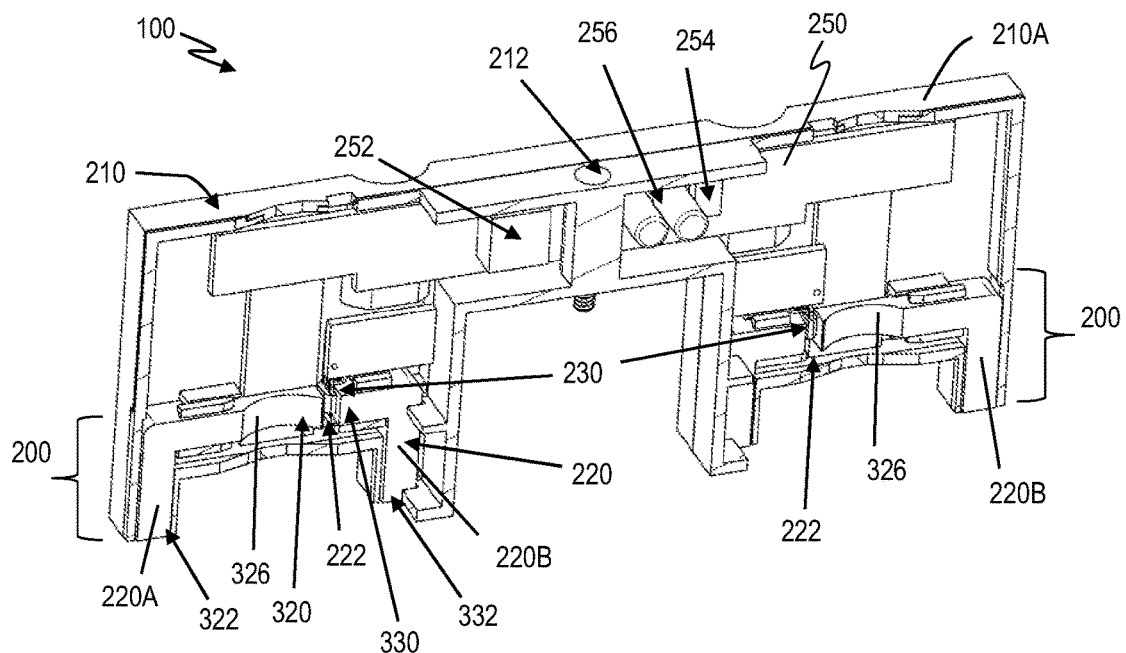
FIGS. 3, 4A, 4B and 4C illustrate different perspective views of the sensor system of FIG. 1 and its components in accordance with an embodiment of the present disclosure.
Figure 4A:
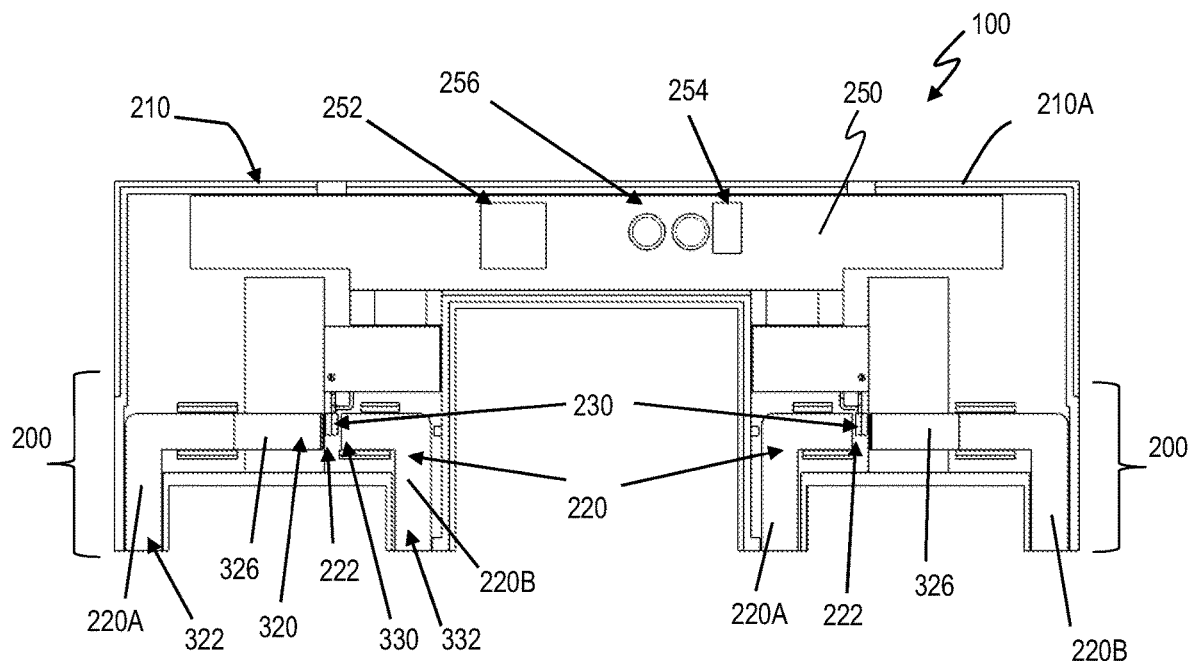
Figure 4B:
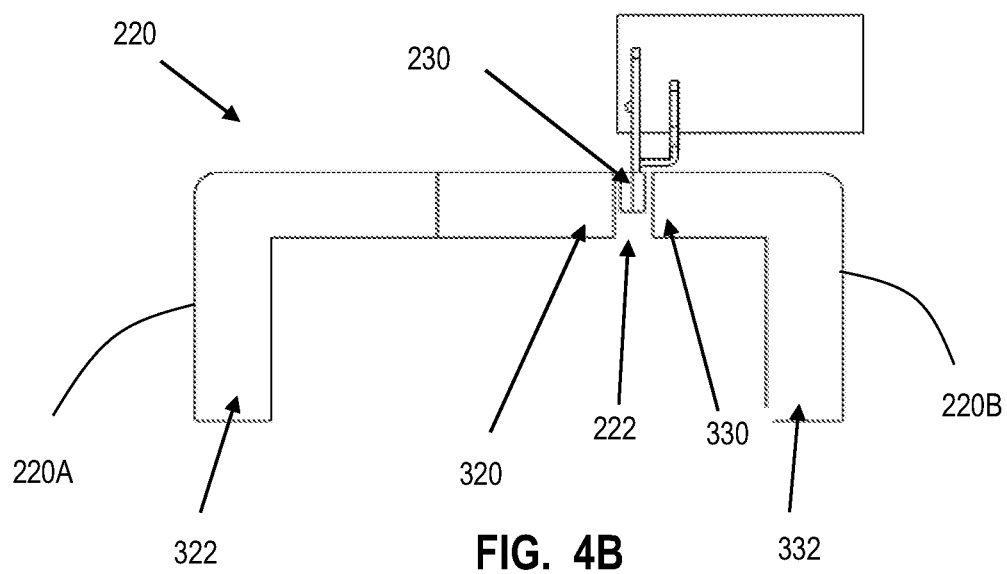
Figure 4C:
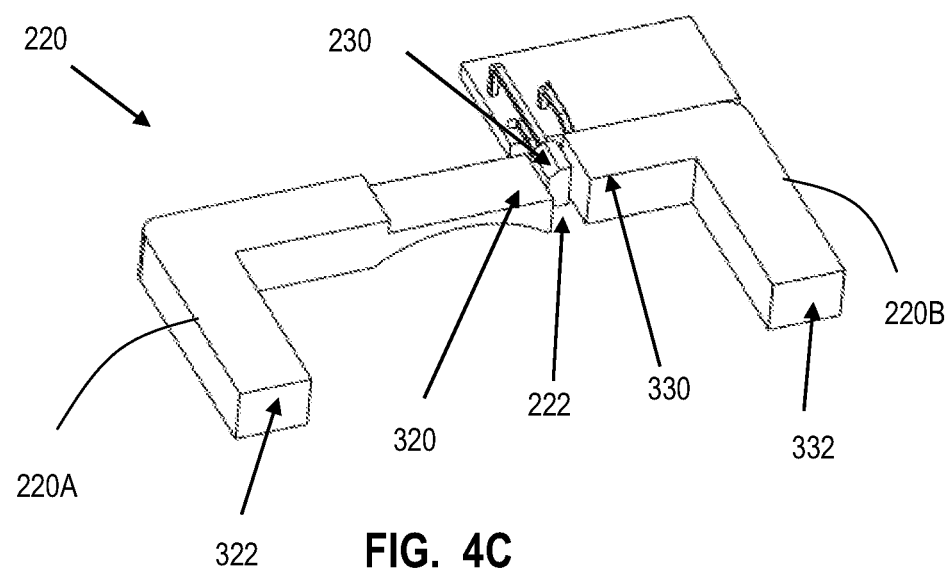

FIGS. 2-4 illustrate example components of the sensor system 100. As shown in these figures, the sensor system 100 can include at least one current-sensing subsystem 200 (or current sensor) to monitor current on a conductor. The sensor system 100 can also include processor(s) and memory (together referred to as "252"), communication device(s) 254, power supply 256, electrical connector(s) 260, and other components that are housed in a housing 210. The various components of the sensor system 100 can be provided, in part, on one or more interconnected circuit boards 250 (e.g., printed circuit board or PCB) or the like. The electrical connector(s) 260 can be a voltage tap or connector such as a pressure connector or other conductive fastener assembly to electrically connect to a panel bus bar or a stud thereof. The connector(s) 260 can be used to monitor voltage on a conductor such as for use in deriving or calculating power on the conductor, and can also provide a power source to operate hardware and other components of the sensor system 100.

As further shown in FIGS. 3-4, each current-sensing subsystem 200 can include a body 220, and a sensor 230 for sensing a magnetic field which corresponds to one or more electrical properties, such as current, to be monitored. The body 220 (hereinafter "ferromagnetic body") includes or is formed of ferromagnetic material(s), such as for example steel. The ferromagnetic body 220 can have one, two or more parts, which can together concentrate magnetic field along a magnetic path (or magnetic circuit) such as for example a ferrite or steel circuit. The sensor 230 can include a Hall-effect sensor (e.g., a linear Hall-effect sensor) or other sensor for sensing a magnetic field and outputting signal(s) representing a corresponding electrical property, such as current. The Hall-effect sensor can, for example, be a series SS39ET/SS49E/SS59ET Hall-effect sensor manufactured by Honeywell. In this example, the ferromagnetic body 220 can include two parts (or components), 220A and 220B, with a gap 222 (e.g., an air gap) arranged therebetween. The sensor 230 can be arranged in the gap 222 to sense magnetic field across the gap, and thus, the magnetic field along the magnetic path provided by the ferromagnetic body 220.

As shown in FIGS. 3, 4A, 4B and 4C, the two parts 220A, 220B of the ferromagnetic body 220 can include or take the form of two legs respectively, which when placed on a load-side of the electrical panel, are configured to form, together with a plane of the electrical panel 10 (not shown), a magnetic path (or circuit) around a conductor to be monitored. The sensor 230, which is arranged in the gap 222, is configured to measure a current or other electrical property representative of current on the conductor to be monitored based on the sensed magnetic field across the gap 222. Each of the two parts 220A, 220B of the ferromagnetic body 220 can have a first end 320, 330 and a second end 322, 332 respectively. The first ends 320, 330 of the two parts 220A, 220B can be separated from each other to form the gap 222, and the second ends 322, 332 can be the ends of the two legs of the ferromagnetic body 220.

In this example, each of the two parts 220A, 220B can be formed in an L-shape, and the ferromagnetic body 220 can have a U-shape. The gap 222 can be formed between adjacent end portions of the first ends 320, 330 of the two parts 220A, 220B respectively. The part 220A can be formed with a recessed-area 326 having a shape that is configured to correspond with a stud (e.g., 30 in FIG. 1) of a conductor on the electrical panel 10. The ferromagnetic body 220 (or its parts) can be formed from a thin sheet of ferromagnetic material (e.g., steel), using for example stamping, cutting and/or other manufacturing techniques.

The processor(s) and memory, generally referred to as "252", can include one or more processors and memory to store data. The processor(s) can be configured to control and manage various operations of the sensor system 100 as described herein. These operations can include but is not limited to: managing and controlling components of the sensor system 100; monitoring, sensing, determining and/or deriving electrical properties (e.g., current, voltage, power, etc.) on at least one conductor(s); reporting information (e.g., information relating to electrical properties on the at least one conductor(s), alarm, etc.) to a remote device or system via the communication device 254, and/or taking other actions in light of the monitored electrical properties on the conductor(s), and so forth. For example, the processor (s) can obtain measurements of current, voltage and other measurable electrical property on a conductor to be monitored, calculate or derive power or other electrical property according to the measurements, and transmit information associated with the measurement(s)/calculations to the remote device or system for further analysis or action (e.g., reporting, alarm, etc.). The memory can store computer executable code, programs, software or instructions, which when executed by at least one processor controls the operations of the sensor system 100, including the various processes described herein. The memory can also store other data used by the sensor system 100 or components thereof to perform the operations described herein.

The communication device 254 can include transmitter(s) and receiver(s) for performing communication via wireline or wireless communication, such as for example, radio, power line carrier, Ethernet, etc.

The housing 210 can be formed of an electrical insulating material. The housing 210 can also include one or more fasteners to detachably connect the housing to the electrical panel. In this example, as shown in FIG. 2, the housing 210 has a clam-shell configuration, which includes a first part 210A and a second part 210B. The housing 210 also includes an opening 212 through which to secure the housing 210 to the electrical panel 10 using a fastener, such as a screw or bolt. The housing 210 can include recess(es) 214 for stub(s) of the conductors, such as bus bars, on the electrical panel 10. The housing 210 can have a U-shape with two housing legs 216. As previously discussed, the sensor system 100 can include two current-sensing subsystems 200, which can be arranged on opposite sides of the housing 210 to measure current on different conductors, such as left-side and right-side bus bars, on an electrical panel. Each of the two current-sensing subsystems 200 can be housed in a corresponding one of the two housing legs 216, and can form a corresponding magnetic path together with a plane of an electrical panel around a corresponding conductor on the electrical panel. Each of the housing legs 216 can have open-ends or opening(s), which are arranged over and onto an electrical panel. For example, the housing 210 can have openings adjacent to the second ends 322, 332 of the ferromagnetic body 220. The housing configuration, such as shown in FIG. 2, is simply provided as one example. It should be understood that the overall shape of the housing 210 and the other components of the sensor system 100 can be configured according to the electrical equipment on which the sensor system 100 is to be employed. Although the housing 210 is shown as being formed of two parts, the housing for the sensor system 100 can be formed as a single-piece or multiple-piece housing, such as from an electrically insulating material (e.g., a dielectric material).

Figure 5:
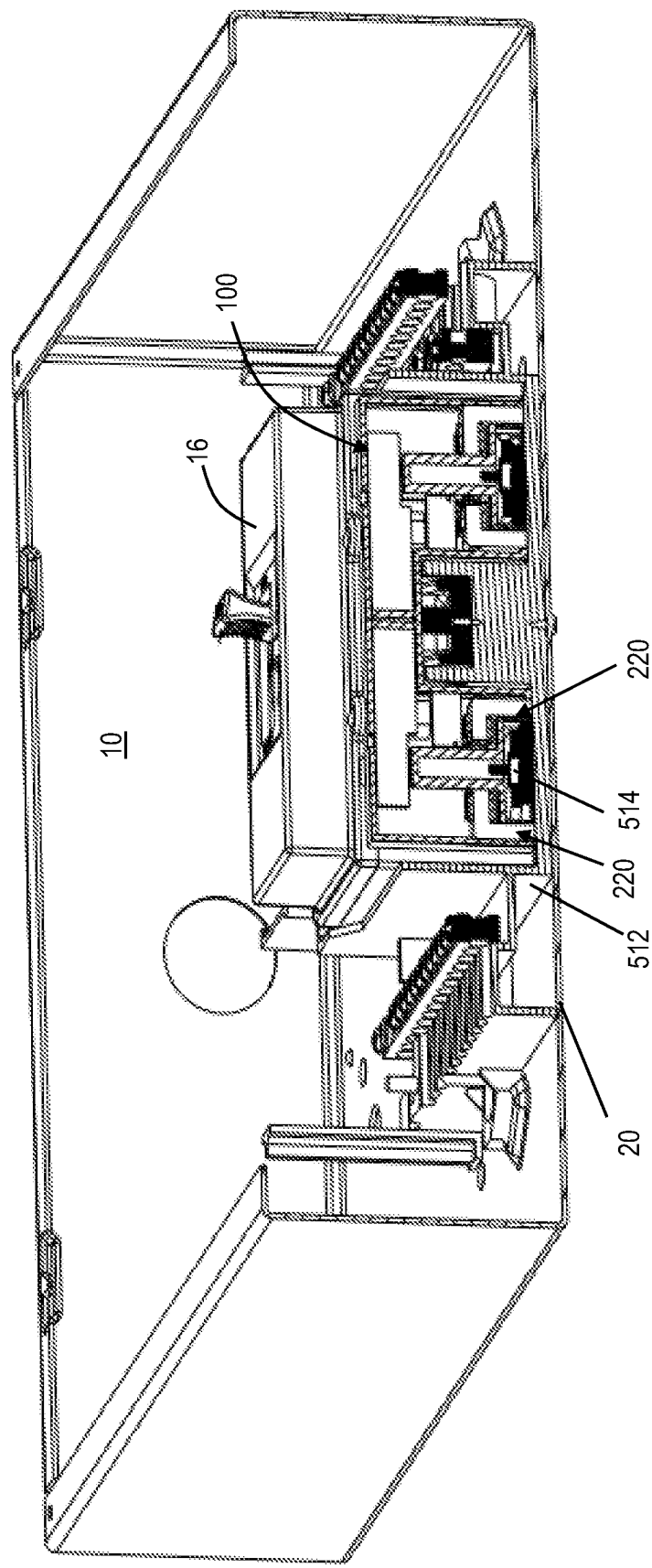
FIG. 5 illustrates a cross-sectional view of the electrical panel with a sensor system, such as in the example of FIG. 1, in accordance with an embodiment of the present disclosure.

FIG. 5 illustrates a cross-sectional view of an electrical panel with a sensor system, such as in the example of FIG. 1, in accordance with an embodiment of the present disclosure. As shown, the electrical panel 10 can include the housing 20, insulator(s) 512, and conductor(s) 514 such as a bus bar(s) to be monitored. The housing 20 (or parts thereof) can be formed of a ferromagnetic material (e.g., steel). The sensor system 100 is installed on the electrical panel 10, with the ferromagnetic body 220 of the current-sensing subsystem 200 together with a plane of the electrical panel 10 forming a magnetic path (or circuit) around the conductor 514, e.g., a bus bar. In this example, the plane of the electrical panel 10 is a back plane, such as a back wall of the housing 20. However, the plane of the electrical panel 10 can be a ferromagnetic plate under the conductor 514.

Figure 6:
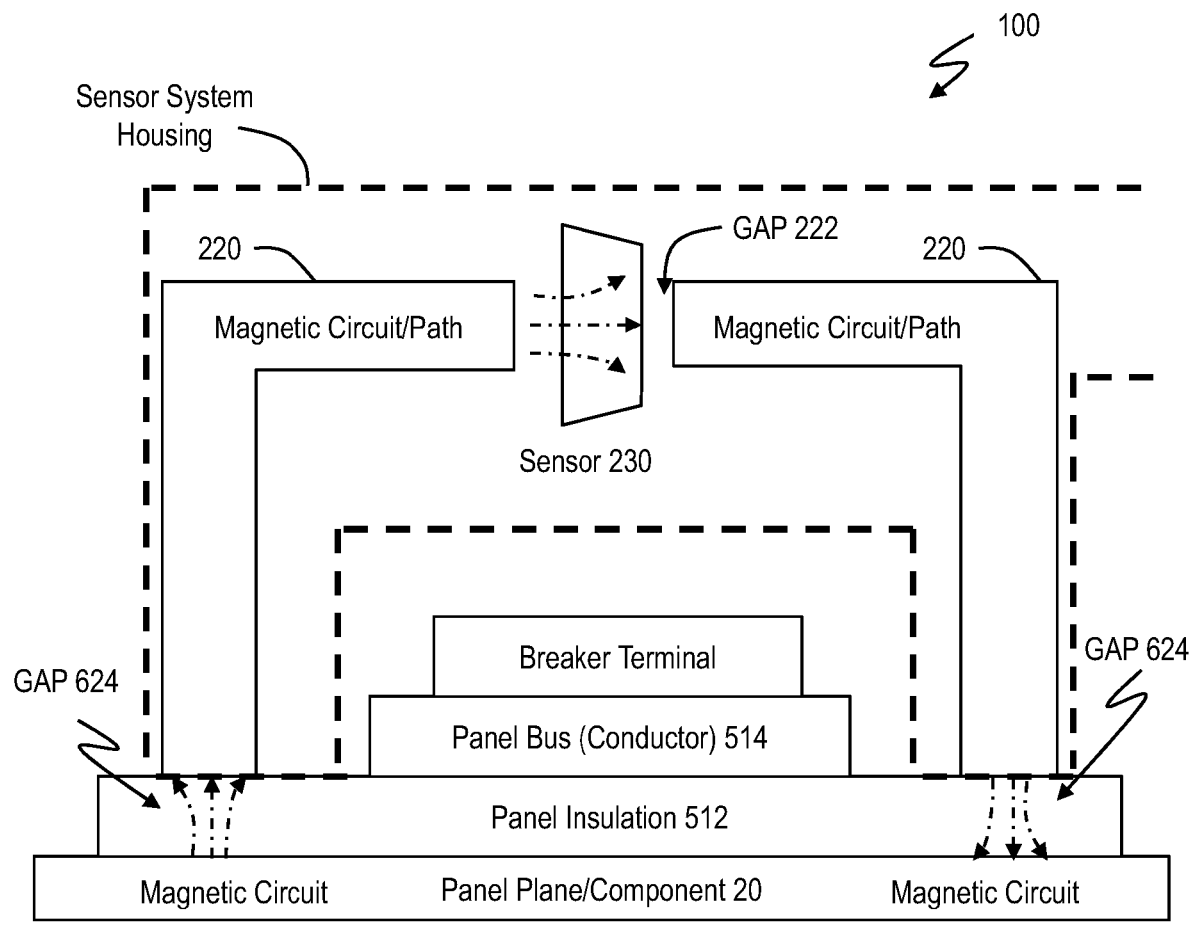
FIG. 6 illustrates a block diagram of a current sensing subsystem of the sensor system of FIGS. 1-5 and a magnetic path (or circuit) which is formed by component(s) of the subsystem and a plane of the electrical panel in accordance with an embodiment of the present disclosure.

As shown in the general block diagram in FIG. 6, when electrical energy is supplied to the conductor 514 of the electrical panel 10, a corresponding magnetic field is generated along a magnetic path (or magnetic circuit) defined by the ferromagnetic body 220 and a ferromagnetic component of the electrical panel 10, such as for example a plane of the electrical panel 10 (e.g., back wall of the housing 20). The magnetic path can include one or more gaps, such as the gap 222 between the parts of the ferromagnetic body and gaps 624 between the ferromagnetic body 220 and a plane of the electrical panel 10 (e.g., a back portion of the housing 20). In this example, the gap 222 can be an air gap, and the gaps 624 can include insulating material of the insulator 512 or may be air gaps. The sensor 230, which is arranged in the gap 222, can sense the magnitude of the magnetic field along the magnetic path and provide a corresponding measurement of an electrical property, such as current on the conductor 514. Other electrical properties of the conductor 514 can also be determined and derived from the current measurement.

The overall effectiveness of the magnetic path may be determined by the gaps (e.g., gap 222 and gaps 624), and thus, the size of the gaps can be configured according to desired measurement resolution and the application. For example, having two large gaps may help reduce sensitivity to installation variation. The install variation may be a small percentage of the overall gap distance.

In one example, to install the sensor system 100, a screw on a load-side is removed on the electrical panel 10, which may need to be replaced or retrofitted with a fastener (or other fastener configuration). The sensor system 100 can then be installed on a load-side of the electrical panel 10, such as between the main circuit breaker 16 and the stud(s) 30 of the conductor(s) to be monitored. A fastener, such as a screw or bolt, can be engaged through the opening 212 (e.g., in FIG. 2) of the housing 210 of the sensor system 100 to a counterpart fastener component (e.g., a female receptacle) on the electrical panel 10 in order to secure the sensor system 100 to the electrical panel 10. The electrical connectors 260 of the sensor system 100 can also be connected to respective studs 30 of conductors to be monitored.

FIGS. 7A, 7B, 8 and 9 illustrate different views of an example sensor system 700 and components thereof in accordance with a further embodiment of the present disclosure. The sensor system 700 can include similar components and operate in a similar manner as the sensor system 100 of FIG. 1. For example, the sensor system can include at least one current-sensing subsystem with a ferromagnetic body and sensor to sense a magnetic field, processor(s), memory, power supply, communication device(s), connector (s) for connecting to a stud of a conductor to be monitored, housing, fastening system for the housing, and so forth. The sensor system 1400 can also be installed on a load-side of an electrical panel 10A.

Figure 8:
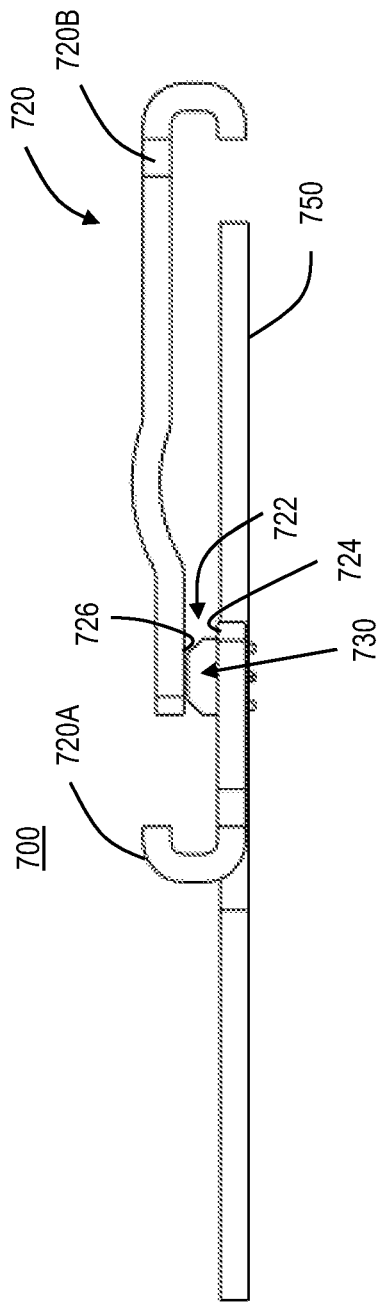
Figure 9:
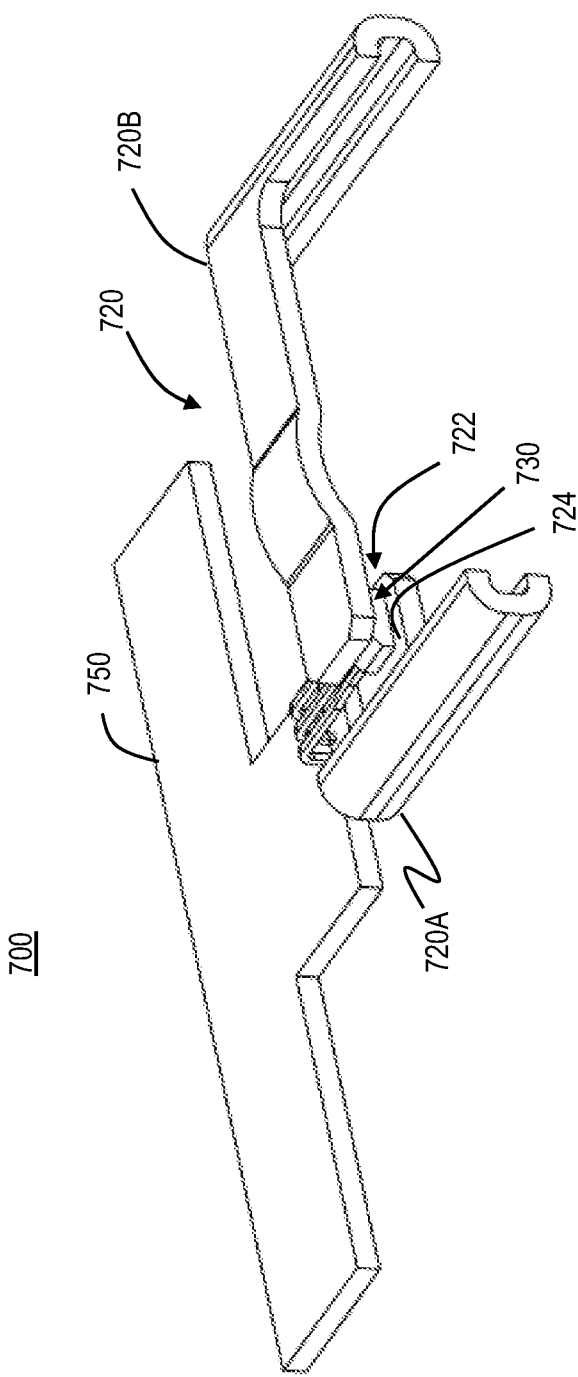

The sensor system 700 can include at least one current-sensing subsystem with a ferromagnetic body 720 and sensor 730, components on one or more circuit boards 750 (e.g., processor(s), memory, communication device, power supply, etc.), electrical connector(s) 760, and other components which are housed together in a housing 710. The housing 710 can be formed of an electrically insulating material. The ferromagnetic body 720 can be formed as one, two or more parts. In this example, the ferromagnetic body 720 includes two parts 720A, 720B, with a gap 722 (e.g., an air gap) therebetween. The gap 722 can be formed between adjacent (or overlapping) side portions 724, 726 at or around the ends of the two parts 720A, 720B respectively, such as shown in FIGS. 8 and 9. The sensor 730 can be arranged to sense the magnetic field across the gap in order to measure current on a conductor, as in the sensor system 100 (previously described above).

The ferromagnetic body 720 can be formed of ferromagnetic material such as steel (e.g., 1/16 inch steel stock), with the parts 720A and 720B which can include legs. The parts 720A, 720B can have an L-shape or right-angle-shape. In this example, the design or shape of the ferromagnetic body 720 and its parts can provide a slimmer or thinner profile, which can lead to better form factor for leaded Hall-effect sensor, or even a small surface mount component and circuit board (e.g., PCB) between the ferromagnetic parts. The thinner ferromagnetic body 720 can also limit Eddy currents better as well. The ferromagnetic body 720 or parts thereof can be formed from a thin sheet of ferromagnetic material, using for example stamping, cutting and/or other manufacturing techniques.

Figure 7A:
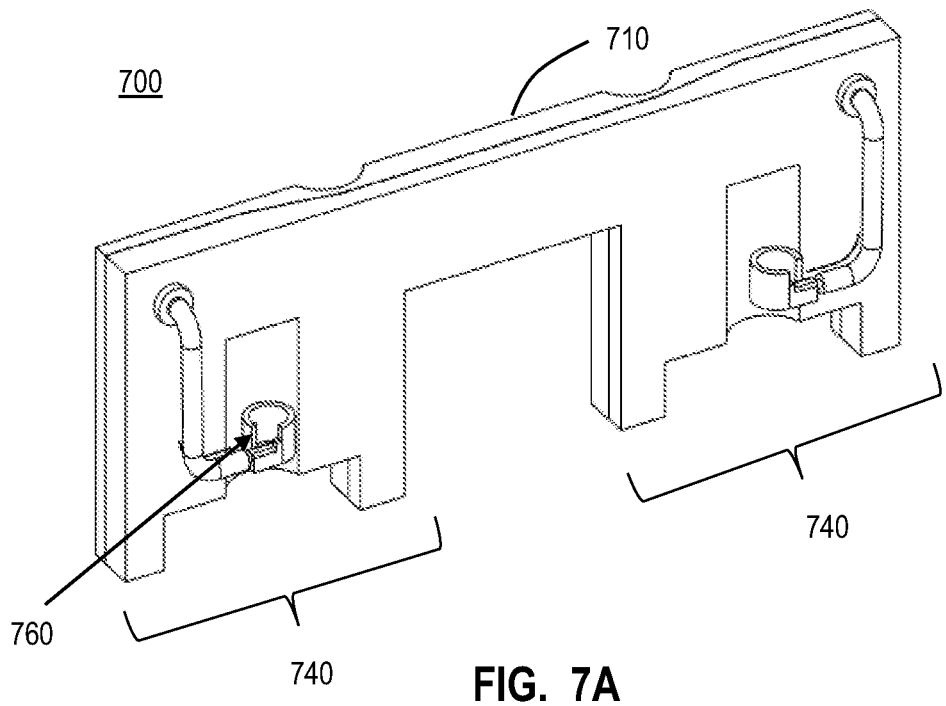
FIGS. 7A, 7B, 8 and 9 illustrate different views and perspectives of an example sensor system and components thereof in accordance with a further embodiment of the present disclosure.
Figure 7B:
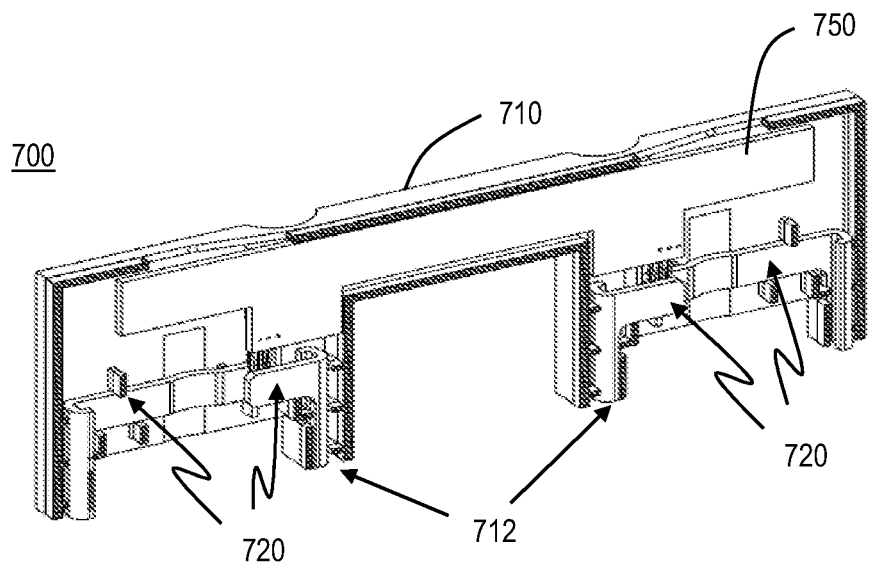

The housing 710 can be formed of an electrical insulating material. In this example, the housing 710 can include various recesses, such for the stub(s) of the conductors or other components on the electrical panel 10A around which the sensor system is to be installed. The housing 710 can also have a U-shape with two housing legs 740. The sensor system 700 can include two current-sensing subsystems, which can be housed on opposite sides of the housing 710 to measure current on different conductors, such as left-side and right-side bus bars, on the electrical panel 10A. For example, each of the two current-sensing subsystems can be housed in a corresponding one of the two housing legs 740. The housing 710 can have open-ends or openings to be arranged over and onto the panel on a load-side. For example, the housing 710 can have openings 712 adjacent to ends of the ferromagnetic body 720 or its legs (which are to be placed in proximity to ferromagnetic plane/component of an electrical panel). The housing configuration in the example of FIGS. 7A and 7B is simply provided as one example. It should be understood that the overall shape of the housing and other components of the sensor system 700 can be configured according to the electrical equipment in which the sensor system 700 is to be employed.

Figure 10:
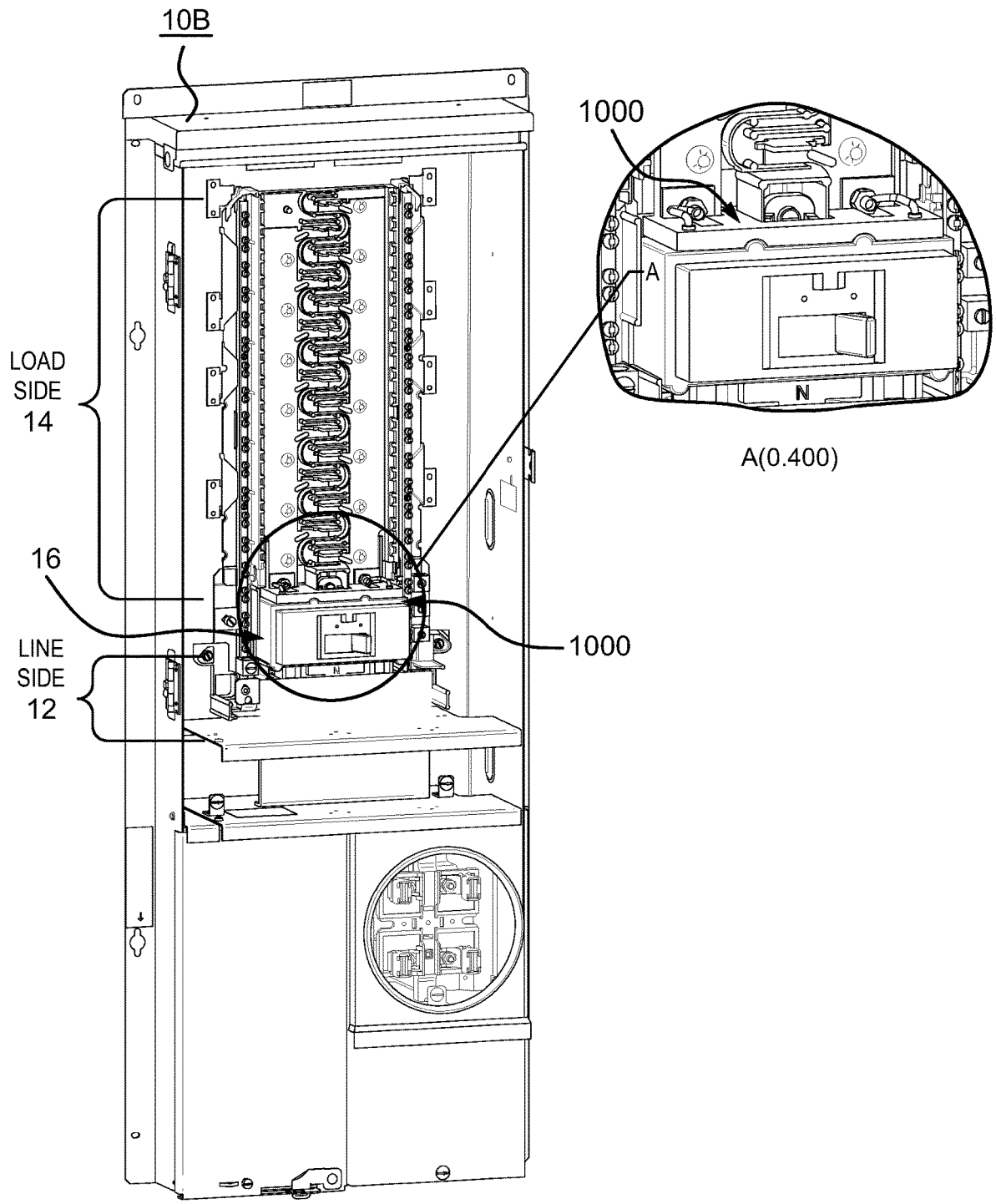
FIG. 10 illustrates an example of a sensor system on another type of electrical panel configuration in accordance with a further embodiment of the present disclosure.

FIG. 10 illustrates an example of a sensor system on another type of electrical panel configuration in accordance with a further embodiment of the present disclosure. As shown, an electrical panel 10B can also include a line-side 12 and a load-side 14, which a circuit breaker 16 provided therebetween. In this example, components of the load-side 14 are arranged above components of the line-side 12 on the electrical panel 10B. A sensor system 1000 (e.g., sensor system 100 or 1400) can be positioned and installed on the load-side 14, such as between the main breaker 16 and stud(s) of conductor(s), such as the bus bar(s). The sensor 1000 can include similar components as the example sensor systems described herein.

Figure 11:
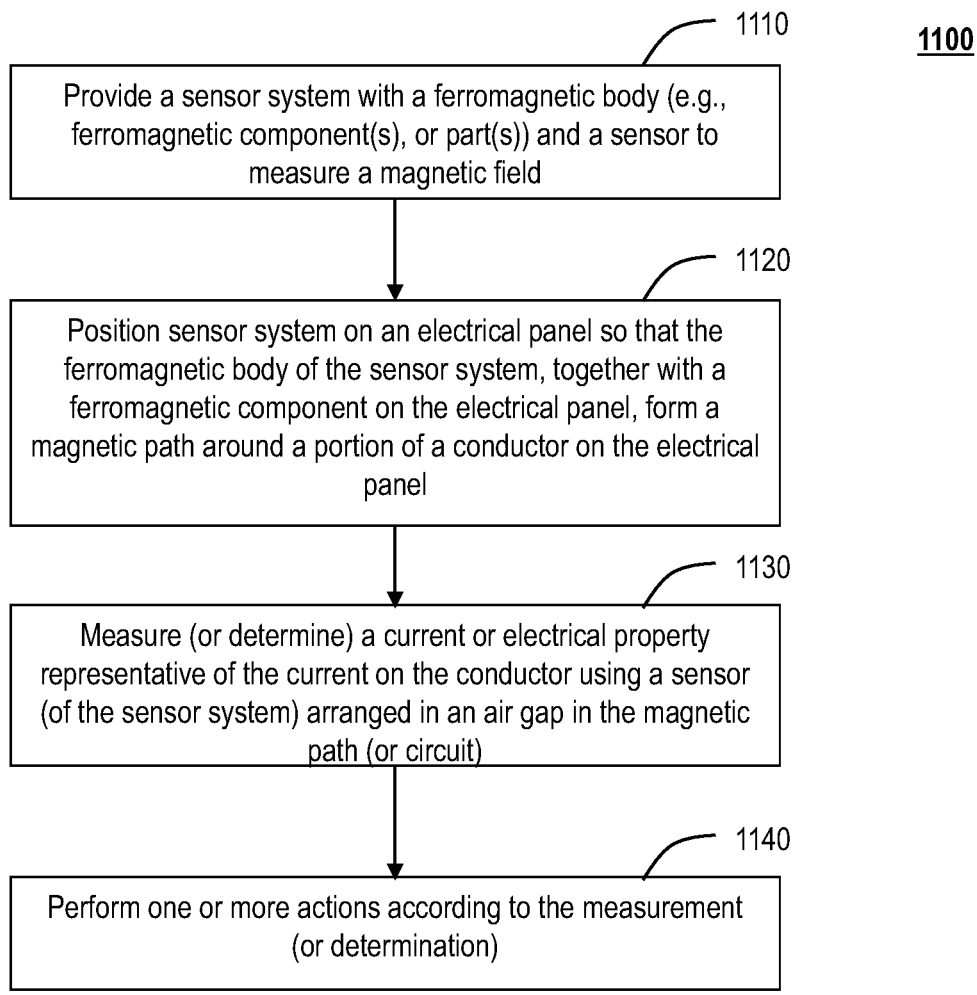
FIG. 11 illustrates an example process by which a sensor system senses, measures, determines and/or outputs electrical propert(ies) of a conductor in accordance with an embodiment of the present disclosure.

FIG. 11 illustrates an example process 1100 by which a sensor system, such as described herein, can sense, measure, determine and/or output information regarding electrical propert(ies) of a conductor in accordance with an embodiment of the present disclosure.

At reference 1110, a sensor system is provided. The sensor system can include a ferromagnetic body with one or more parts (or components) formed of a ferromagnetic material. The sensor system can also include a sensor to measure a magnetic field, such as for example a Hall-effect sensor.

At reference 1120, the sensor system can be positioned on an electrical panel (e.g., panelboard) so that the ferromagnetic body of the sensor system, together with a ferromagnetic component on the electrical panel, can form a magnetic path (or magnetic circuit) around a portion of a conductor on the electrical panel. The ferromagnetic component on the electrical panel can be a portion of a plate or a wall of a housing, which is made of a ferromagnetic material.

At reference 1130, a current or electrical property representative of the current on the conductor can be measured (or determined) using the sensor which is arranged in an air gap in the magnetic path (or circuit). The sensor can sense the magnetic field across the air gap, and output a signal(s) corresponding to a measurement of the current on the conductor or electrical property representative of the current on the conductor.

At reference 1140, one or more actions can be performed according to the measurement (or determination). For example, information associated with the measurement(s) can be transmitted to a remote device or system for further analysis or action (e.g., reporting, alarm, etc.). Furthermore, in various embodiments, the sensor system can monitor current as well as voltage on a conductor, and determine or derive power on the conductor using at least these two parameters. Such power data or other data relating to electrical properties on the conductor can be communicated out to the cloud or other remote device or system, such as a management system for a power system.

Although the process 1100 describes operations for measuring (or determining) a current on a conductor, other electrical properties can be measured, determined or derived using the sensor system, such as described herein. These other electrical properties can include voltage, power and so forth in relations to a conductor monitored by the sensor system on an electrical panel.

Figure 12:
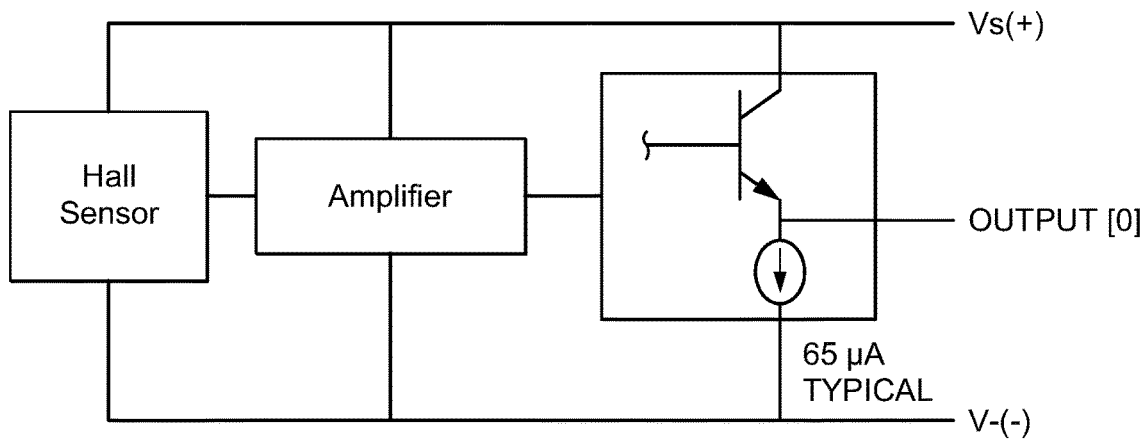
FIG. 12 illustrates an example current sourcing output block diagram of a Hall-effect sensor configuration in accordance with an embodiment of the present disclosure.
Figure 13:
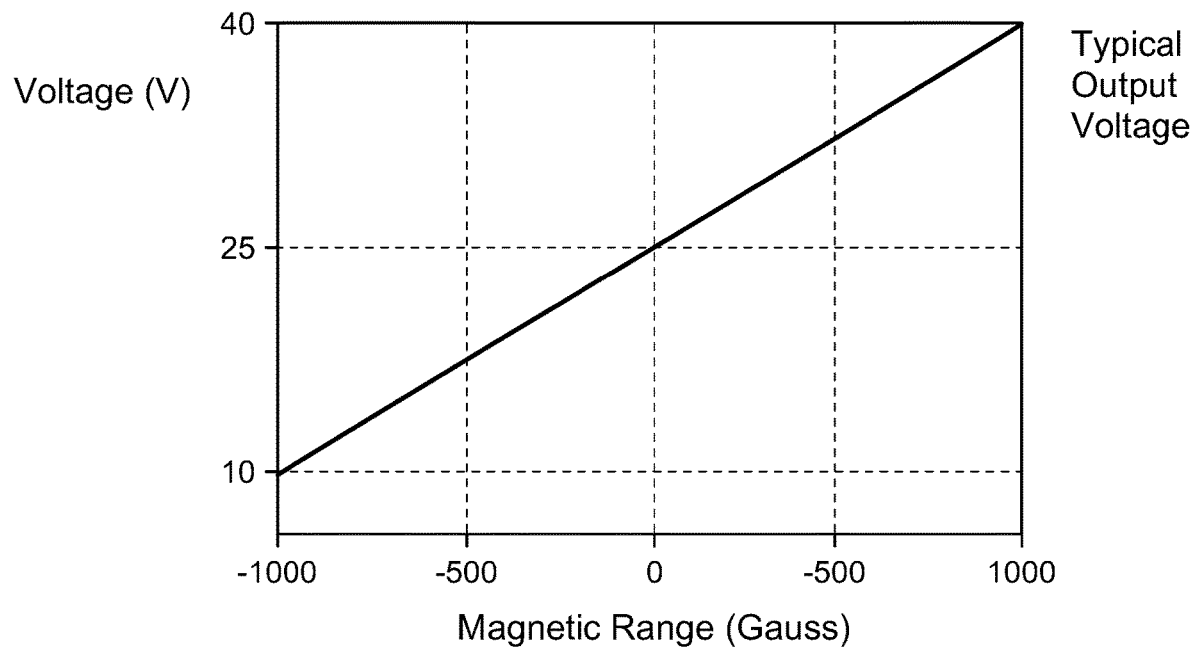
FIG. 13 illustrates example output characteristics of a Hall-effect sensor configuration in accordance with an embodiment of the present disclosure.

FIG. 12 illustrates an example current sourcing output block diagram of a Hall-effect sensor configuration 1200 in accordance with an embodiment of the present disclosure. As shown in FIG. 12, the sensor configuration can include a Hall-effect sensor to measure a magnitude of a magnetic field which is output as a voltage signal that is proportional to the magnitude of the magnetic field. The sensor configuration can also include conditioning circuits (e.g., amplifier), and an output stage/block (e.g., using bipolar transistor) to output a signal representative of a current according to the voltage signal from the Hall-effect sensor. As shown in FIG. 13, an example of a transfer characteristic of a Hall-effect sensor is shown in an example graph 1300 of voltage versus magnetic range.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

A processor(s) or controller(s) as described herein can be a processing system, which can include one or more processors, such as CPU, GPU, controller, FPGA (Field Programmable Gate Array), ASIC (Application-Specific Integrated Circuit) or other dedicated circuitry or other processing unit, which controls the operations of the devices or systems, described herein. Memory/storage devices can include, but are not limited to, disks, solid state drives, optical disks, removable memory devices such as smart cards, SIMs, WIMs, semiconductor memories such as RAM, ROM, PROMS, etc.

This disclosure is not limited in its application to the details of construction and the arrangement of components set forth in the following descriptions or illustrated by the drawings. The disclosure is capable of other embodiments and of being practiced or of being carried out in various ways. Also, the phraseology and terminology used herein is for description purposes and should not be regarded as limiting. The use of "including," "comprising," "having," "containing," "involving," and variations herein, are meant to be open-ended, i.e. "including but not limited to."

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

I claim:

1. An apparatus for sensing current on a conductor in an electrical panel, comprising:
    at least one sensing system comprising:
        a ferromagnetic body having two legs, which when placed on a load-side of the electrical panel is configured to form, together with at least a plane of the electrical panel, a magnetic path around the conductor, the ferromagnetic body comprising at least two parts with a first air gap therebetween along the magnetic path, wherein the plane of the electrical panel comprises ferromagnetic part of a wall of a housing for the electrical panel or part of a ferromagnetic plate installed below the conductor on the electrical panel, and
        a sensor, arranged in the first air gap, to measure a current or other electrical property representative of current on the conductor based on the magnetic field across the first air gap.

2. The apparatus of claim 1, wherein the sensor is a Hall effect sensor.

3. The apparatus of claim 1, wherein each of the two parts has a first end and a second end, the first ends of the two parts being separated to form the first air gap, the second ends being ends of the two legs.

4. The apparatus of claim 3, wherein each of the two parts is formed in an L-shape and the body has a U-shape.

5. The apparatus of claim 3, wherein the first air gap is formed between adjacent side portions of the first ends of the two parts or between adjacent end portions of the first ends of the two parts.

6. The apparatus of claim 1, wherein the electrical panel comprises a panel board or a load center.

7. The apparatus of claim 1, further comprising:
    a communication device to perform wireless or wireline communication with a remote device; and
    a processor, in communication with the sensor and the communication device, configured to receive a measurement from the sensor, and to transmit information associated with the measurement to the remote device.

8. The apparatus of claim 7, further comprising a housing for housing one or more sensing systems, the processor and the communication device.

9. The apparatus of claim 8, further comprising one or more fasteners to detachably connect the housing to the electrical panel.

10. The apparatus of claim 8, wherein the housing is configured to fit adjacent to a load-side of a main breaker on the electrical panel.

11. The apparatus of claim 8, wherein the housing has a U-shape with two housing legs, the one or more sensing systems including a first one of the sensing systems and a second one of the sensing systems, each of the first and second sensing systems being housed in a corresponding one of the two housing legs, each of the first and second sensing systems being configured to form a corresponding magnetic path together with the plane of the electrical panel around a corresponding conductor on the electrical panel, each of the corresponding conductors being a bus bar on the electrical panel.

12. The apparatus of claim 11, further comprising voltage connectors configured to connect to corresponding bus studs of the corresponding bus bars.

13. The apparatus of claim 12, wherein each of the two housing legs is configured to be arranged between a load-side of the main circuit breaker and a corresponding bus stud of the electrical panel.

14. The apparatus of claim 1, wherein each end of the two legs is configured to form second and third air gaps with the plane of the electrical panel along the magnetic path.

15. The apparatus of claim 14, wherein the first, second or third air gap comprises one of air or an insulator.

16. A method of sensing current on a conductor in an electrical panel, comprising:
  providing a ferromagnetic body having two legs, which when placed on a load-side of the electrical panel is configured to form, together with at least a plane of the electrical panel, a magnetic path around the conductor, the ferromagnetic body comprising at least two parts with a first air gap therebetween along the magnetic path, wherein the plane of the electrical panel comprises ferromagnetic part of a wall of a housing for the electrical panel or part of a ferromagnetic plate installed below the conductor on the electrical panel; and
  measuring, via a sensor arranged in the first air gap, a current or other electrical property representative of current on the conductor based on the magnetic field across the first air gap.

* * * * *